United States Patent [19]
Hong et al.

[11] Patent Number: 6,046,938
[45] Date of Patent: Apr. 4, 2000

[54] STRUCTURE OF A FLASH MEMORY

[75] Inventors: Gary Hong, Hsinchu; Wenchi Ting, Taipei; Joe Ko, Hsinchu, all of Taiwan

[73] Assignee: United Semiconductor Corp., Hsinchu, Taiwan

[21] Appl. No.: 09/191,326

[22] Filed: Nov. 13, 1998

[30] Foreign Application Priority Data

Jul. 15, 1998 [TW] Taiwan ................................. 87111486

[51] Int. Cl.[7] ................................................. G11C 16/04
[52] U.S. Cl. ................................ 365/185.05; 365/185.06; 365/185.11
[58] Field of Search .................... 365/185.05, 185.06, 365/185.11, 230.03; 257/315, 316, 319

[56] References Cited

U.S. PATENT DOCUMENTS

| 5,528,537 | 6/1996 | Lee et al. | 365/185.11 |
| 5,590,072 | 12/1996 | Choi | 365/185.01 |
| 5,698,879 | 12/1997 | Aritome et al. | 257/315 |
| 5,875,128 | 2/1999 | Ishizuka et al. | 365/185.06 |

*Primary Examiner*—Son T. Dinh
*Attorney, Agent, or Firm*—J.C. Patents; Jiawei Huang

[57] ABSTRACT

A structure of a flash memory is disclosed. The flash memory includes a common drain, a memory unit which has at least one memory cell, and a depletion mode selector transistor. The depletion mode selector transistor isolates the common drain and the memory unit. Two terminals the depletion mode selector transistor are coupled to the common drain and the memory unit, respectively.

7 Claims, 5 Drawing Sheets

STRUCTURE OF A FLASH MEMORY

CROSS-REFERENCE TO RELATED APPLICATION

This application claims the priority benefit of Taiwan application serial no. 87111486, filed Jul. 15, 1998, the full disclosure of which is incorporated herein by reference.

BACKGROUND OF THE INVENTION

1. Field of the Invention

The invention relates in general to a structure of a flash memory, and more particularly to a flash memory structure with less body effect.

2. Description of the Related Art

Nonvolatile memory is widely applied in a variety of electrical devices such as storing structure data, program data and other multiple writing and reading data. Within the programmable nonvolatile memories, electrically erasable and programmable nonvolatile memories (EEPROMs) are now of great interest since they are widely applied in personal computers and electrical equipment. Conventional EEPROMs include floating gate transistor structure, which has the advantages of writing, erasable, and storing data but also has the disadvantages of low speed. However, the newly developed flash memory structure EEPROM has higher speed of writing and reading.

Typically, n-channel EEPROM and flash EEPROM devices adopt a selector transistor in an array of memory cells or a sector of memory cells. In the latter case, the selector transistor is often called a sector select gate. Enhancement mode transistor is typically used as a selector transistor. The function of the selector transistor is to isolate memory cells and common bit lines connected to a large amount of memory cells. Referring to FIG. 1, it shows the structure of a conventional NAND memory cell. During the operation of reading, the select gate 100a of the selected memory cell 100 is turned on so that the data stored at the floating gate of the memory cell can be tested by a sense amplifier. The select gates 104a, 106a of the other memory cells 104, 106 are turned off so that the non-selected memory cells 104, 106 will not disturb the operation of reading. Conclusively, the enhancement mode n-channel transistor is used as a select gate.

During the operation of programming, the function of the selector transistor is also to isolate the non-selected memory cells and the bit line. Referring to FIG. 2, generally, a high voltage of about 12–20 V is provided to the bit line 200. For a selected memory cell 202, since the select gate 202a is turned on, the high voltage on the bit line can be transferred to the drain region of a selected floating gate transistor. The high voltage induces Fowler-Nordeim tunneling so that the electrons stored at the floating gate go into the tunneling window to complete the operation of programming. For the non-selected memory cells 204, 206, since the select gates 204a, 206a are turned off as the bit line 200 is kept in the state of high voltage, the charges stored at the floating gate can be prevented from the influence of programming.

During the above-mentioned operation of programming, body effect often occurs. Referring to FIG. 3, it illustrates the body effect of a n-channel MOSFET. As the voltage provided to the drain electrode P is 10 V and the voltage provided to the gate electrode R is 5 V, the voltage of the source electrode Q approaches (5 V-$V_T$), wherein $V_T$ represents threshold voltage. The threshold obtained by the foregoing method is much higher than the one of an equal MOSFET device with its source electrode grounded. This effect is therefore called body effect. For example, as the source electrode of the MOSFET device is grounded, the threshold voltage of it is about 0.7 V. On the other hand, the device as shown in FIG. 3 has a threshold voltage of nearly 1.2 V and a source voltage of 3.8 V due to source bias. It is therefore apparent that as the source electrode is in the state of reverse bias there is a tendency of increasing threshold voltage. As a result, the voltage provided to the selector transistor gate R is necessarily higher than the voltage provided to the drain electrode, which is about 2–5 V, to overcome the body effect of the enhancement mode select gate. However, higher voltage increases the energy consumption and cost.

SUMMARY OF THE INVENTION

It is therefore an object of the invention to utilize a depletion mode transistor to be a select gate. The depletion mode transistor has lower body effect and has negative threshold voltage. The gate bias does not have to be higher than the one of the drain electrode but a positive voltage can transfer from the drain electrode to the source electrode. Consequently, the maximum operation voltage of the device can be significantly reduced.

A structure of a flash memory is disclosed. The flash memory includes a common drain, a memory unit which has at least one memory cell, and a depletion mode selector transistor. The depletion mode selector transistor isolates the common drain and the memory unit. Two terminals the depletion mode selector transistor are coupled to the common drain and the memory unit, respectively.

BRIEF DESCRIPTION OF THE DRAWINGS OF THE DRAWINGS

Other objects, features, and advantages of the invention will become apparent from the following detailed description of the preferred but non-limiting embodiments. The description is made with reference to the accompanying drawings in wription of the preferred but non-limiting embodiments. The description is made with reference to the accompanying drawings in which.

DESCRIPTION OF THE PREFERRED EMBODIMENT

Figure 1:
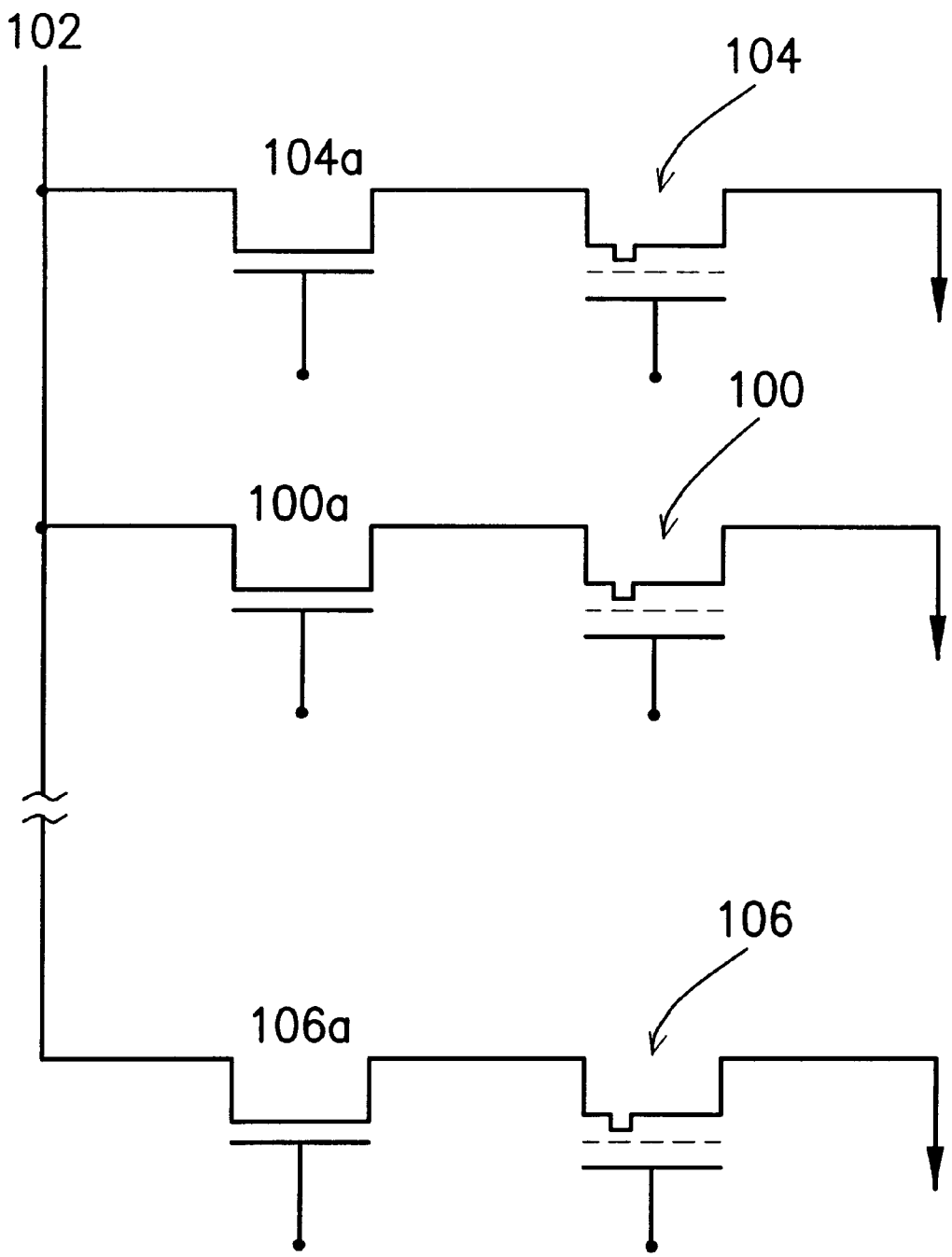
FIG. 1 shows the circuit diagram of the conventional flash memory.
Figure 2:
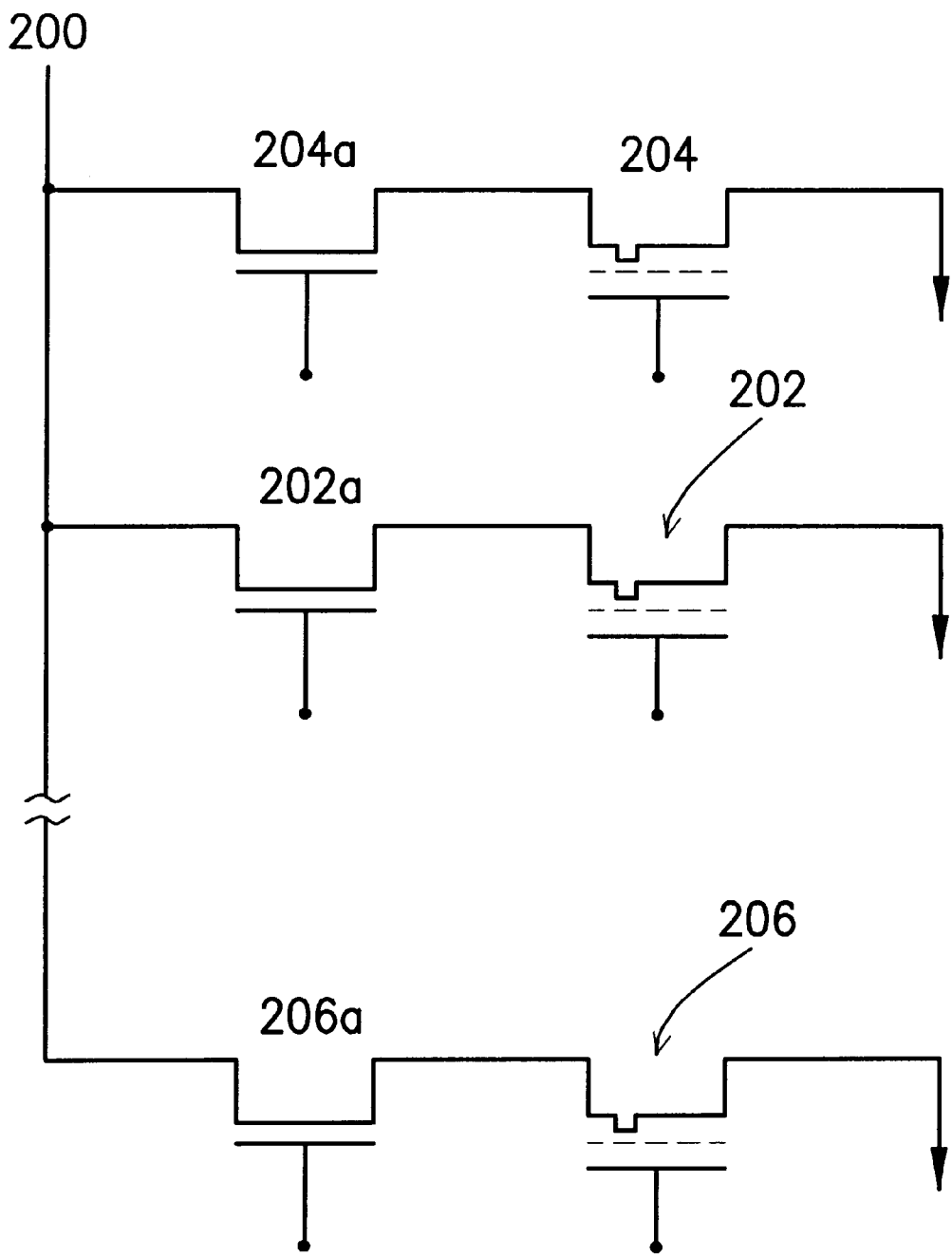
FIG. 2 illustrates the programming of the conventional flash memory.
Figure 3:
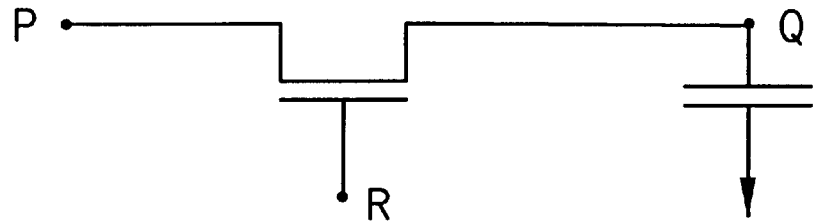
FIG. 3 illustrates the body effect of the conventional flash memory.
Figure 4:
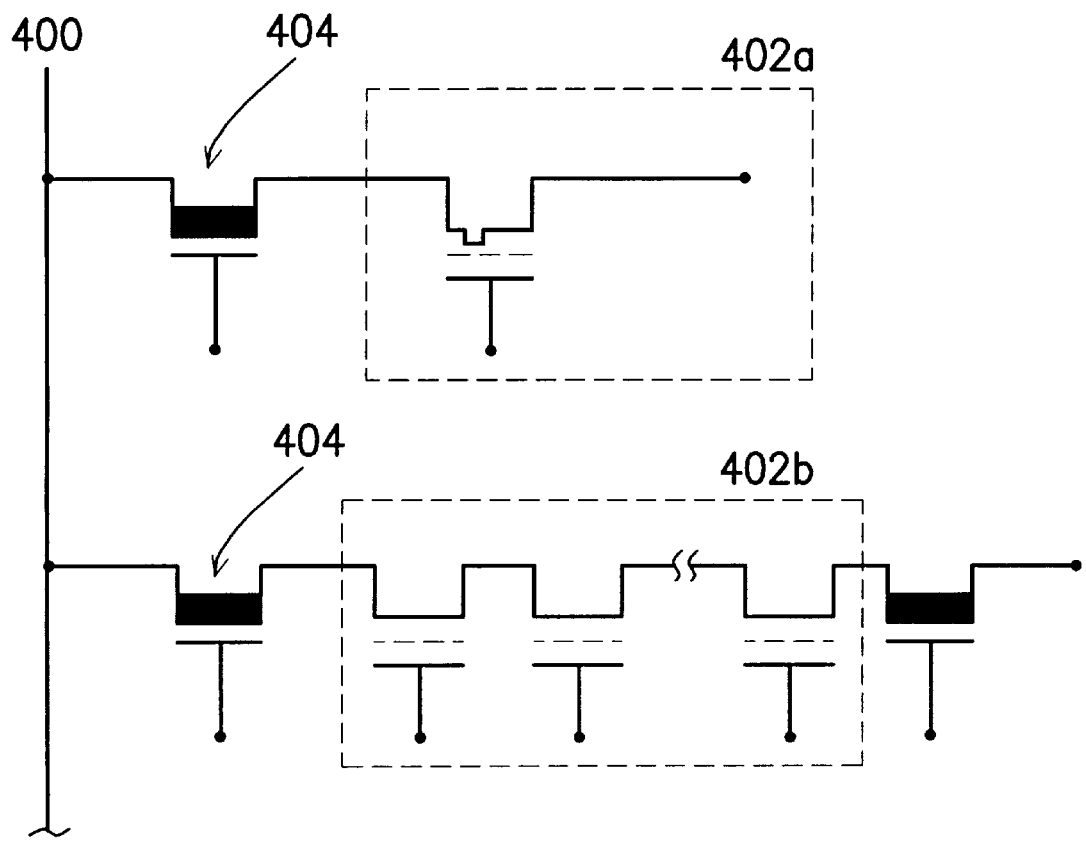
FIG. 4 shows the circuit diagram of a flash memory according to a preferred embodiment of the invention.

Referring to FIG. 4, this circuit diagram includes a common drain 400 and memory units 402a, 402b. Each of the memory units 402a, 402b includes at least one memory cell or a number of memory cells. To avoid the high threshold voltage induced by body effect, a depletion mode selector transistor 404 is used instead of a conventional enhancement mode selector transistor. The depletion mode selector transistor 404 isolates the memory units 402a, 402b from the common drain 400. One terminal of the depletion mode selector transistor 404 is coupled to the memory units 402a, 402b and the other terminal of it is coupled to the common drain 400.

An n-type depletion mode transistor is an n-channel transistor with negative threshold voltage. For example, an enhancement mode transistor has a threshold voltage of about 0.4 V~1 V but a depletion mode transistor has a threshold voltage of about −0.2 V~−2 V. The process of fabricating a depletion mode transistor is rather similar to that of fabricating an enhancement mode transistor. The mainly difference is the step of channel doping. For an enhancement mode n-channel transistor, boron is preferrably used to be implanted or diffusion doped to form a channel doped region. On the other hand, for a depletion mode transistor, arsenic, phosphorous or antimony is preferred impurity for channel doping.

Figure 5:
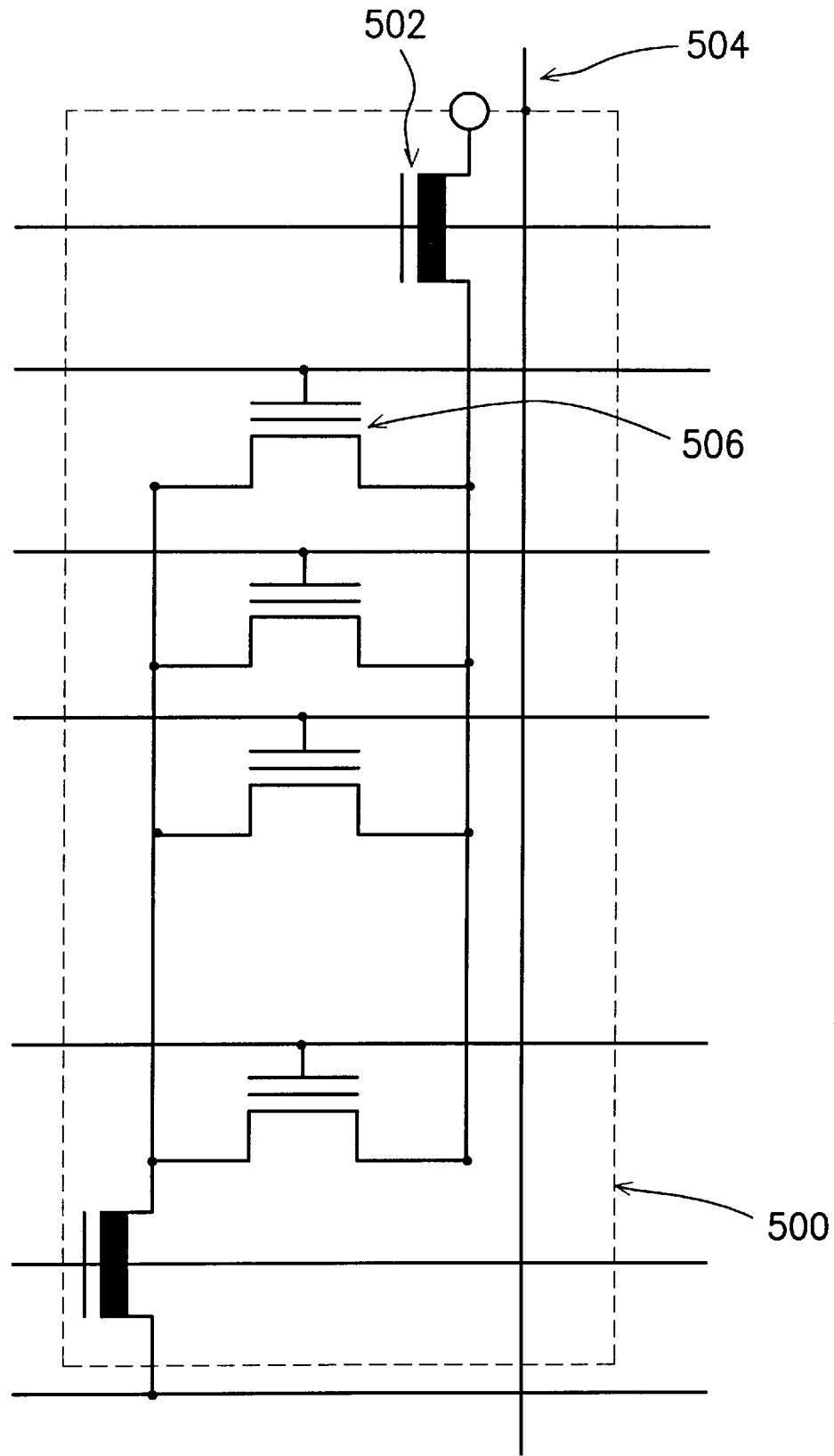
FIG. 5 shows the circuit diagram of a flash memory using NOR memory cells according to a preferred embodiment of the invention.
Figure 6:
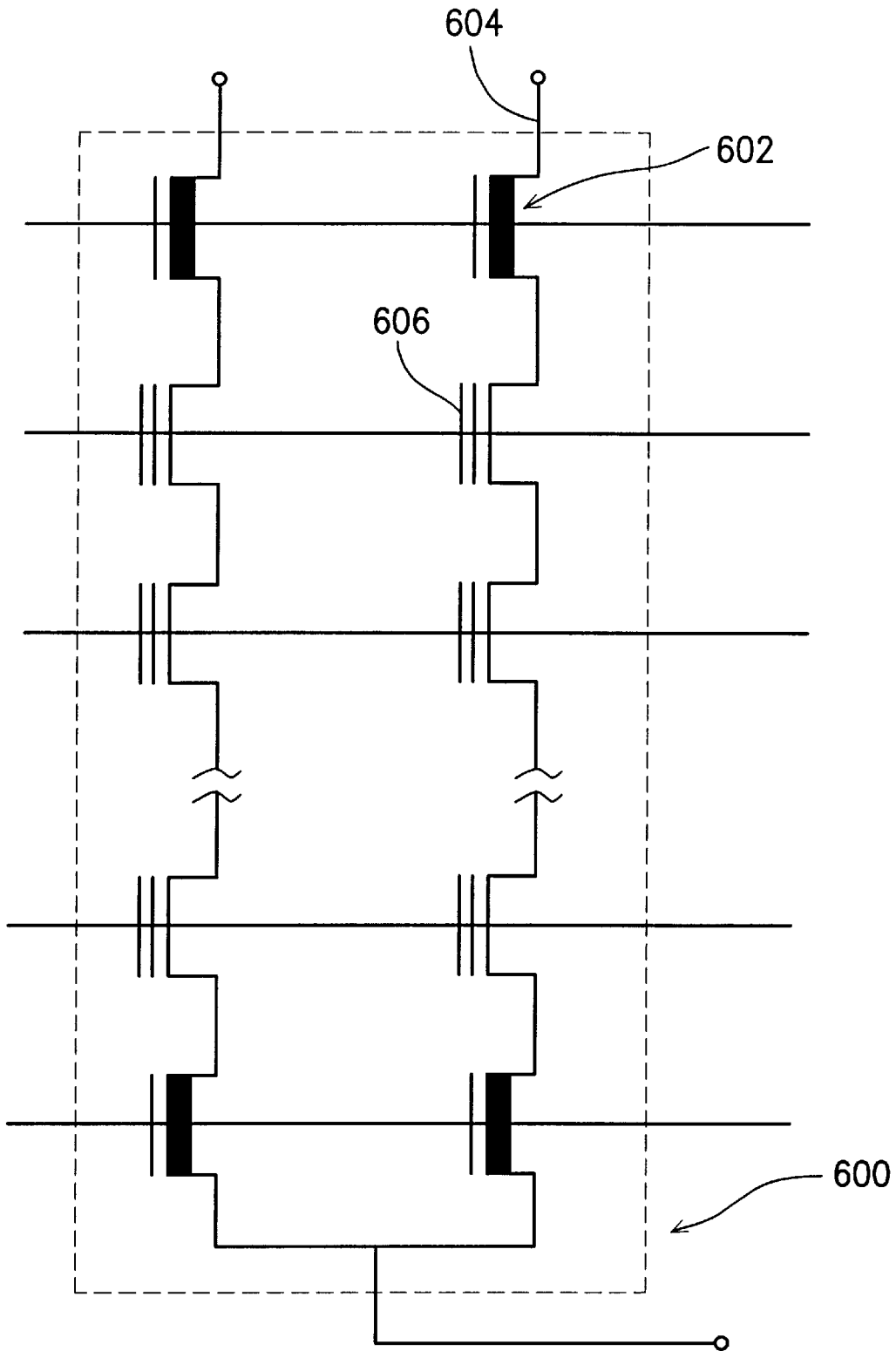
FIG. 6 shows the circuit diagram of a flash memory using NAND memory cells according to a preferred embodiment of the invention.

The memory unit can also be a number of serially connected memory cells or a number of parallel connected memory cells. Referring to FIG. 5, the memory unit is an NOR memory unit 500. NOR memory unit 500 includes a number of parallel connected memory cells 506. The depletion mode transistor 502 is coupled to the common drain 504 and NOR memory unit 500. Referring to FIG. 6, the memory unit is an NAND memory unit 600. NAND memory unit 600 includes a number of serially connected memory cells 606. The depletion mode transistor 602 is coupled to the common drain 604 and the NAND memory unit 600.

While the invention has been described by way of example and terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. An electrically erasable and programmable read only memory unit, comprising:

a memory cell; and a depletion mode selector transistor having a first terminal directly coupled to the memory cell with no other device being connected between the memory cell and the first terminal and a second terminal directly coupled to a common drain with no any other device being connected between the common drain and the second terminal.

2. A flash memory, comprising:

a memory unit comprising a plurality of memory cells connected with each other, the memory unit having a first and a second terminal;

a first depletion mode select transistor, coupled directly to the first terminal of the memory unit and a common drain; and a second depletion mode select transistor, coupled directly to the second terminal.

3. The flash memory according to claim 2, wherein the memory cells are connected in series.

4. The flash memory according to claim 2, wherein the memory cells are connected in parallel.

5. A flash memory without using any enhancement mode select transistor, comprising:

a memory unit, comprising a plurality of electrically erasable and programmable read only memory cells electrically connected with each other, the memory unit has a first terminal and a second terminal;

a first depletion mode transistor, directly connected between a common drain and the first terminal; and a second depletion mode transistor mode transistor, directly connected to the second terminal.

6. The flash memory according to claim 5, wherein the electrically erasable and programmable read only memory cells are connected in series.

7. The flash memory according to claim 5, wherein the electrically erasable and programmable read only memory cells are connected in parallel.

* * * * *